(12) United States Patent
Tan et al.

(10) Patent No.: US 6,988,258 B2
(45) Date of Patent: Jan. 17, 2006

(54) MASK-PROGRAMMABLE LOGIC DEVICE WITH BUILDING BLOCK ARCHITECTURE

(75) Inventors: Kim Pin Tan, Penang (MY); Boon Jin Ang, Butterworth (MY); Bee Yee Ng, Termerloh (MY)

(73) Assignee: Altera Corporation, San Jose, CA (US)

( * ) Notice: Subject to any disclaimer, the term of this patent is extended or adjusted under 35 U.S.C. 154(b) by 123 days.

(21) Appl. No.: 10/316,237

(22) Filed: Dec. 9, 2002

(65) Prior Publication Data

US 2004/0111691 A1 Jun. 10, 2004

(51) Int. Cl.
*G06F 17/50* (2006.01)

(52) U.S. Cl. .......................................... 716/17; 716/16
(58) Field of Classification Search .................. 716/17, 716/16
See application file for complete search history.

(56) References Cited

U.S. PATENT DOCUMENTS

| | | | | |
|---|---|---|---|---|
| 5,055,716 A | * | 10/1991 | El Gamel | 326/42 |
| 5,289,021 A | * | 2/1994 | El Gamal | 257/206 |
| 5,341,041 A | * | 8/1994 | El Gamal | 326/44 |
| 5,825,202 A | | 10/1998 | Tavana et al. | 326/39 |
| 5,874,834 A | | 2/1999 | New | 326/39 |
| 5,926,035 A | * | 7/1999 | Raza | 326/38 |
| 5,943,488 A | * | 8/1999 | Raza | 716/19 |
| 6,091,262 A | | 7/2000 | New | 326/39 |
| 6,094,065 A | | 7/2000 | Tavana et al. | 326/39 |
| 6,118,299 A | * | 9/2000 | Raza | 326/39 |
| 6,242,945 B1 | | 6/2001 | New | 326/39 |
| 6,490,707 B1 | | 12/2002 | Baxter | 716/2 |
| 6,515,509 B1 | | 2/2003 | Baxter | 326/39 |
| 6,526,563 B1 | | 2/2003 | Baxter | 716/18 |

OTHER PUBLICATIONS

Altera Corporation, "HardCopy Devices for APEX 20K Conversion Data Sheet," Sep. 2001, ver. 1.0.
AMI Semiconductor, Inc.,. "Introducing XPressArray™: The Industry's First 0.18μ Hybrid Gate Array," Jan. 2002 (downloaded Oct. 22, 2002 from http://www.amis.com/pdf/xpressarray bkgrdr.pdf).
AMI Semiconductor, Inc.,. "XPressArray™ 0.18μ Hybrid Gate Array" Feature Sheet, (downloaded Oct. 22, 2002 from http://www.amis.com/pdf/xpressarray_featuresheet.pdf).
AMI Semiconductor, Inc.,. "XPressArray™ 0.18μ Hybrid Gate Array" Data Sheet, (downloaded Oct. 22, 2002 from http://www.amis.com/pdf/xpressarray_datasheet.pdf).
AMI Semiconductor, Inc., Press Release: "AMI Semiconductor Launches Revolutionary Hybrid Gate Array Technology to Reduce Cycle Time, Unit Price and Slash NRE Costs by 70 Percent: New 0.18–micron XPressArray™ platform provides industry's first FPGA–to–ASIC conversion path for drop–in replacement of 1.8V Xilinx Virtex–E and Altera APEX–E," Jan. 21, 2002 (visited Oct. 22, 2002 at http://www.amis.com/news/020121_xpressarray.cfm).

* cited by examiner

*Primary Examiner*—Stacy A. Whitmore
*Assistant Examiner*—Brandon Bowers
(74) *Attorney, Agent, or Firm*—Fish & Neave IP Group of Ropes & Gray LLP; Jeffrey H. Ingerman

(57) ABSTRACT

A mask-programmable logic device includes logical building blocks that can be connected together to form various logical units for programmable logic. Functionality of a comparable conventional programmable logic device can be provided with fewer gates in this way than by providing all of the gates normally present on that comparable conventional programmable logic device, resulting in fewer unused gates in the devices once mask-programmed.

39 Claims, 7 Drawing Sheets

MASK-PROGRAMMABLE LOGIC DEVICE WITH BUILDING BLOCK ARCHITECTURE

BACKGROUND OF THE INVENTION

This invention relates to mask-programmable logic devices having logical building blocks for constructing logic units on the device as part of the mask-programming of the device.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources are those actually needed for the particular design. In addition, those resources are simple metallizations, so there are no general purpose switching elements consuming space or power, or slowing down signals.

Nevertheless, because mask-programmable logic devices up until now have been based on comparable conventional programmable logic devices by the same manufacturer, they have included arrangements of logic elements essentially identical to the arrangements of logic elements in the comparable conventional programmable logic devices, differing substantially only in the absence of the programmable configuration components. Although such mask-programmable devices provide significant savings in size and power consumption over the comparable conventional programmable logic devices, analysis of user designs has revealed that in currently available mask-programmable logic devices, a significant portion of the logic elements remain unused in most user designs. Accordingly, it would be advantageous to be able to provide a mask-programmable logic device that provides the size and speed advantages of previously known mask-programmable logic devices, but has fewer unused components after implementation of a user design, while preserving the ability to mimic the logic capabilities of a particular conventional programmable logic device.

SUMMARY OF THE INVENTION

In accordance with this invention, a mask-programmable logic device is provided that, instead of being merely a copy of the corresponding conventional programmable logic device with the programmable configuration and interconnect layers removed, is a completely different structure that nevertheless can be mapped functionally to the corresponding conventional programmable logic device. The structure preferably includes an arrangement of "intelligent macrocells" (as described below) and conventional gate arrays that together serve as modular "logic building blocks" from which more complex logic units can be constructed as needed.

A user design preferably is developed in the same way as with previously known mask-programmable logic devices. Specifically, a user develops and proves a design in a conventional programmable logic device. After the user is satisfied that the design works as intended, the user provides the configuration information for the design to the manufacturer or supplier of a mask-programmable logic device in accordance with this invention that is compatible with the conventional programmable logic device on which the design was proven. Ordinarily, the mask-programmable logic device and the comparable conventional programmable logic device are from the same manufacturer or supplier.

The mask-programmable logic device, as manufactured, includes the aforementioned arrangement of intelligent macrocells and conventional gate arrays, with no interconnect structure. The manufacturer or supplier uses the user's configuration information for the conventional programmable logic device to design one or more metallization layers that will interconnect the intelligent macrocells and the conventional gate arrays into whatever more complex logic units are needed to implement the user design, and that also will program those logic units by making connections as necessary internally to the logic units, and will interconnect those logic units as necessary to implement that design. Preferably, a software tool, similar to those used with previously known mask-programmable logic devices, is used to lay out the interconnections necessary to implement the user design from the conventional programmable logic device in the mask-programmable logic device.

A mask-programmable logic device according to the invention, corresponding to a particular conventional programmable logic device, is more flexible than a previously-know mask-programmable logic device corresponding to that same conventional programmable logic device, because the various elements of the logic structure have no predetermined locations. This may allow a user to reduce the number of components that remain unused in most user designs, because the greater flexibility of devices according to the invention may allow a user design to be implemented on a smaller device than would have been possible with a fixed logic layout. The number of components is designed based on empirical analysis of user designs to minimize wasted or unused components without preventing implementation of designs that could be implemented in the comparable conventional programmable logic device. In order to facilitate implementation of user designs, a "logic building block" approach preferably is used, according to which predetermined combinations of different numbers of the aforementioned intelligent macrocells and conventional gate arrays, as described in more detail below, are used to form different ones of the conventional logic units typically available on a conventional or mask-programmable logic device of the previously known type.

The present invention includes not only the mask-programmable base device, but also the mask-programmed device after application of the programming metallization layer or layers, as well as the method of programming such a device. In addition, although the invention is described primarily in connection with mask-programmable logic devices, it also may have application to conventional programmable logic devices specifically, it may be desirable in some applications to provide programmable logic devices using the logic building block approach described herein, but where a programmable interconnect structure is provided and used to form the connections between the logic building blocks, as well as the connections within the logic building blocks that program those blocks.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention uses a logic building block approach to provide mask-programmable logic devices in which there are fewer unused components after implementation of a user design. The logic building block approach allows implementation in a mask-programmable logic device of a user design that mimics a design proved on a convention programmable logic device, without requiring that the mask-programmable logic device be manufactured with all of the same logic units as the comparable conventional programmable logic device.

Figure 1:
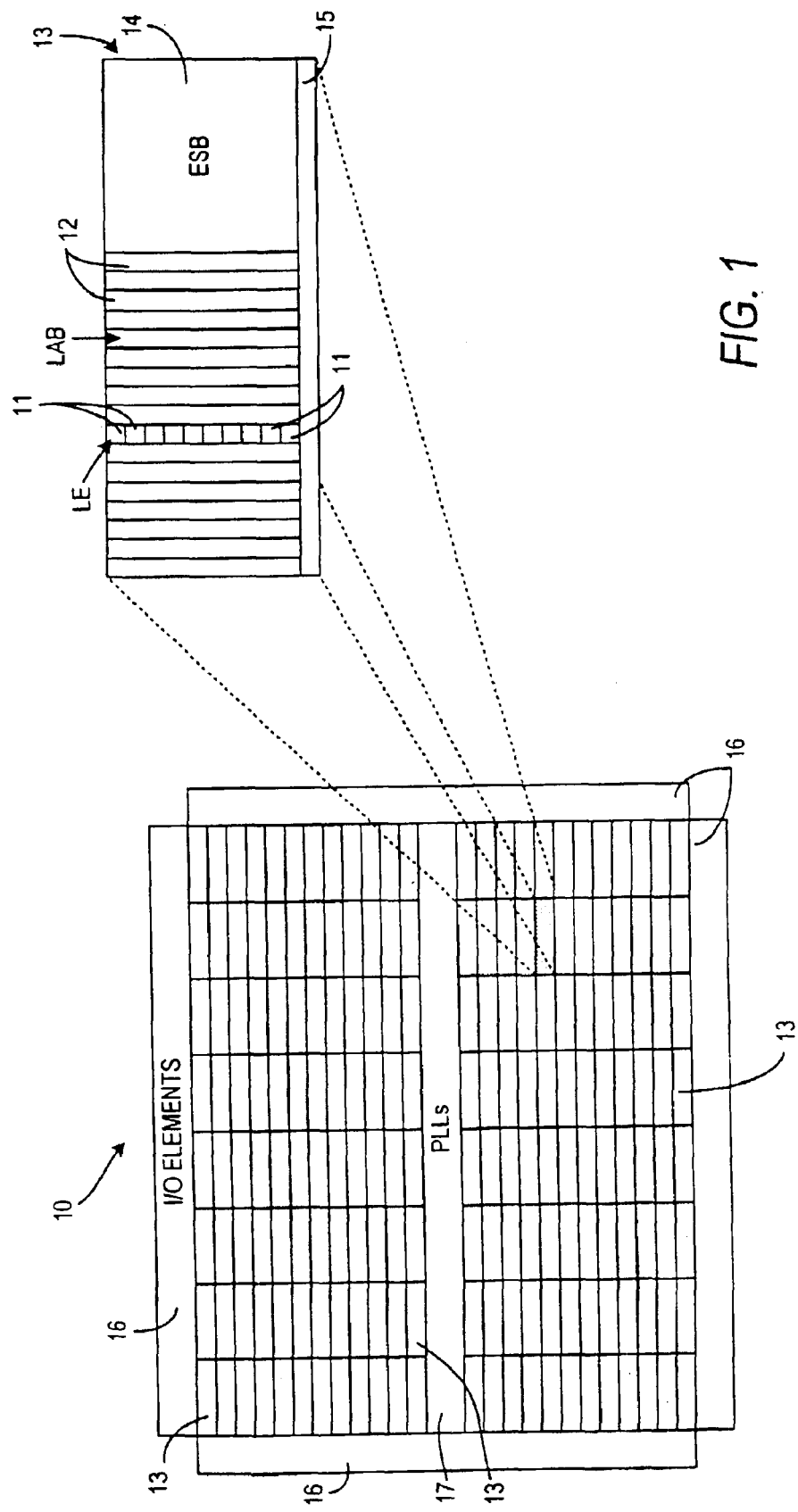
FIG. 1 is a schematic representation of a previously known mask-programmable logic device.

FIG. 1 shows a mask-programmable logic device 10 from the HardCopy™ family of mask-programmable logic devices available from Altera Corporation, of San Jose, Calif., the assignee hereof. Mask-programmable logic device 10 itself includes an array of logic regions similar to those found in the APEX™ family of conventional programmable logic devices avialable from Altera Corporation. In summary, those logic regions include, at the most basic level, "logic elements" (LEs) 11, which may be, for example, look-up table-based logic regions having four inputs and a register providing the ability to have registered or unregistered output. Logic elements 11 may be grouped into "logic array blocks" (LABs) 12. In the embodiment shown, each LAB 12 includes ten LEs 11, although other numbers of LEs 11 could be grouped into each LAB 12. The LABs may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" or ESB) 14. Each GOL 13 preferably also includes a strip 15 of auxiliary gates, which may be used, e.g., for buffering of particular signals, such as high-fanout signals.

As shown, the GOLs 13 preferably are arranged in an orthogonal array, in rows and columns. Input/output elements preferably are located in regions 16 around the periphery of the array. Other auxiliary circuits, such as phase-locked loops for timing, etc., preferably are provided at convenient locations within the array, such as in region 17, shown in about the center of the array.

Figure 2:
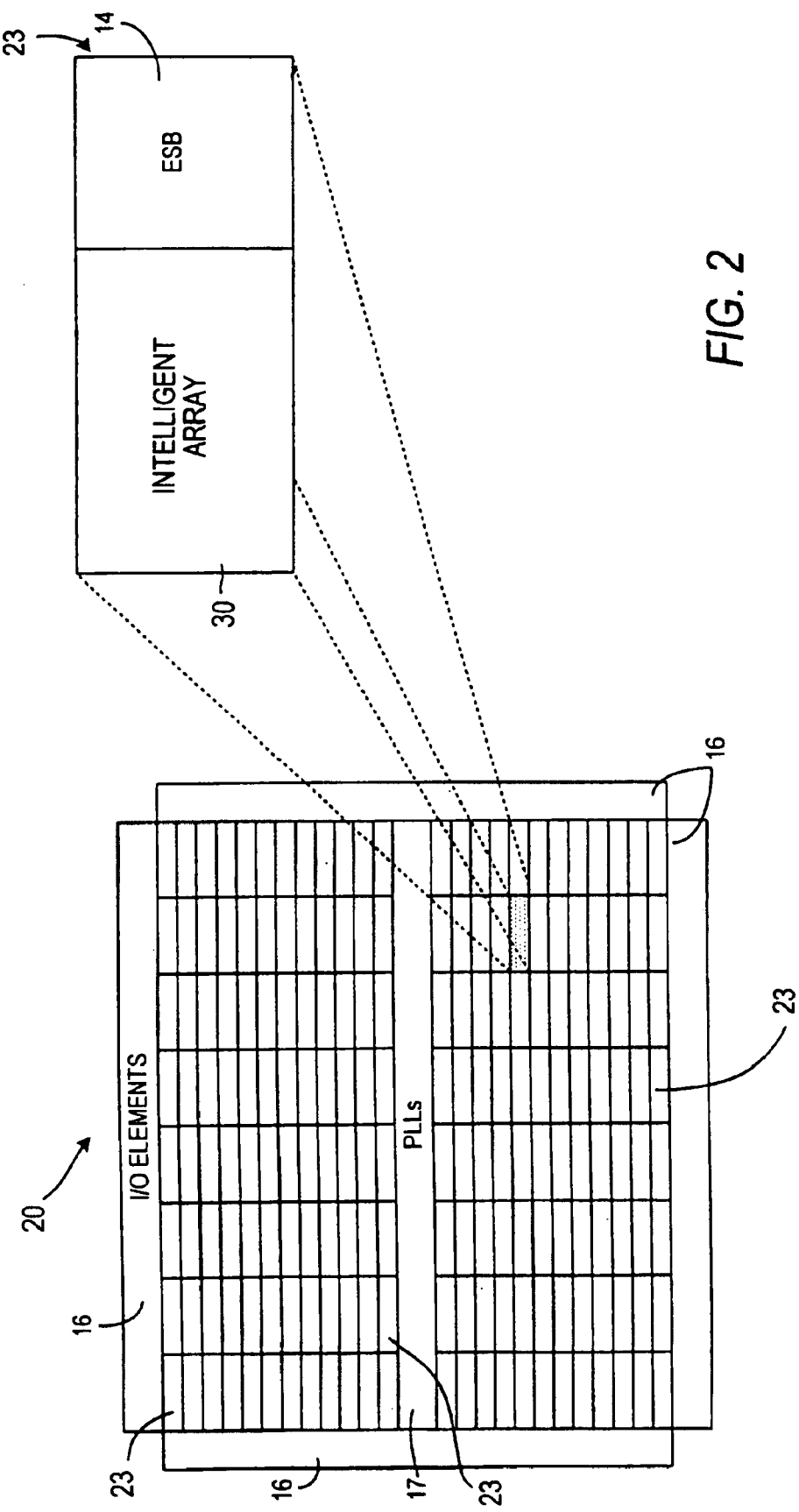
FIG. 2 is a schematic representation of a preferred embodiment of a mask-programmable logic device in accordance with the present invention.

In the preferred embodiment shown in FIG. 2, mask-programmable logic device 20 in accordance with the present invention preferably is similar in many ways to mask-programmable logic device 10. Thus, mask-programmable logic device 20 has input/output elements preferably located in regions 16 around its periphery, and other auxiliary circuits, such as phase-locked loops for timing, etc., preferably provided at convenient locations within the array, such as in region 17.

Device 20 preferably also has regions 23 that are functionally equivalent to GOLs 13, preferably including the provision therein of ESBs 14. However, instead of having an array of LEs 11 arranged in LABs 12, each region 23 preferably includes instead an intelligent array 30 (see FIG. 3), preferably including columns 31 of intelligent macrocells 40 (see FIG. 4) and columns 32 of conventional gate array units 60 (see FIG. 6). The components of intelligent array 30 preferably are used to construct LEs and registers and combine them into LABs, as well to construct other devices, as needed for a particular user design.

Figure 3:
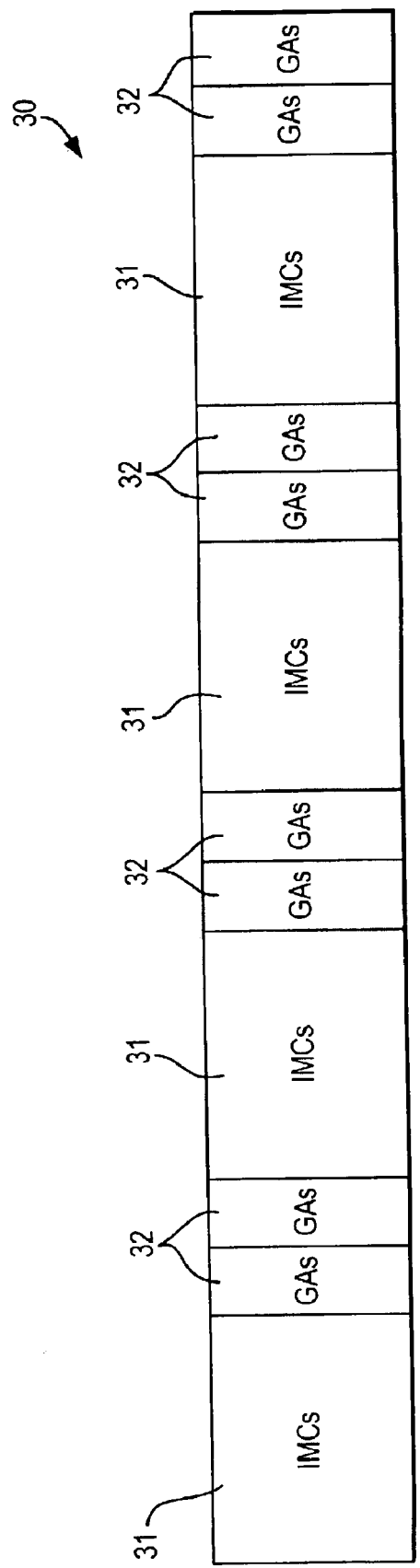
FIG. 3 is a schematic representation of a preferred embodiment of an intelligent base array according to the present invention.

In one preferred embodiment shown in FIG. 3, intelligent array 30 includes four columns 31 of intelligent macrocells (IMCs) 40. Intelligent array 30 preferably also includes two columns 32 of gate arrays (GAs) 60 adjacent each column 31 of intelligent macrocells 40. Thus, the arrangement shown in FIG. 3 is a column 31 of intelligent macrocells 40, followed by two columns 32 of gate array units 60, followed by a column 31 of intelligent macrocells 40, followed by two columns 32 of gate array units 60, followed by a column 31 of intelligent macrocells 40, followed by two columns 32 of gate array units 60, followed by a column 31 of intelligent macrocells 40, followed by two final columns 32 of gate array units 60. The number of intelligent macrocells 40 and gate array units 60 in each of columns 31, 32, as well as the particular arrangement of columns 31, 32 (which may be different in other embodiments) is chosen based on the conventional programmable logic device to which the mask-programmable logic device is to correspond—i.e., the conventional programmable logic device on which users will develop their logic designs before committing them to the mask-programmable logic device—taking into account statistics regarding component usage in user designs, so that substantially any user design in the comparable conventional programmable logic device will be able to be implemented in the mask-programmable logic device. The number of intelligent macrocells 40 in each column 31, and the number of gate array units 60 in each column 32, ordinarily will depend on the size of the particular device and the distribution of other components on the device.

Figure 4:
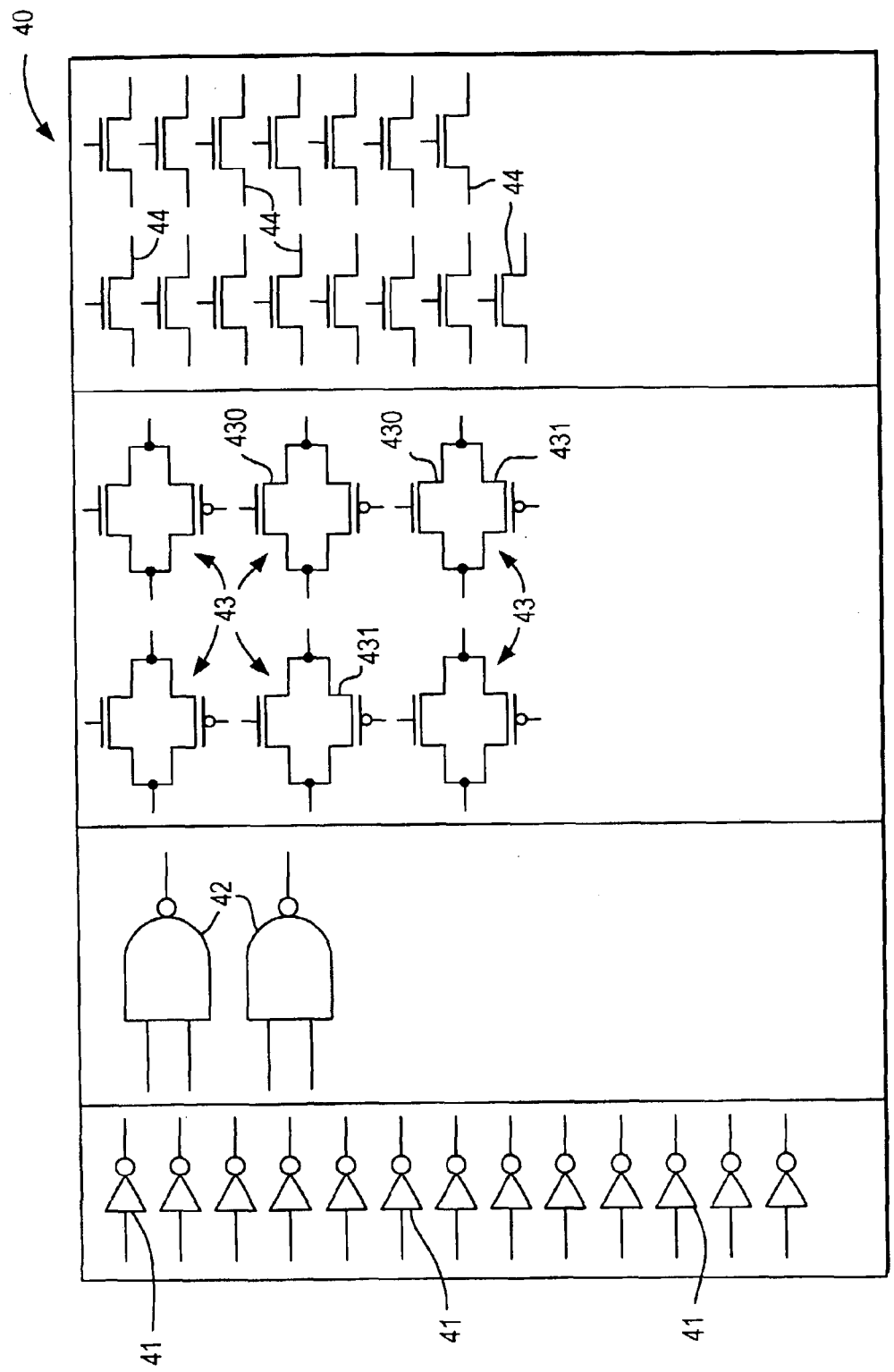
FIG. 4 is a schematic representation of a preferred embodiment of an intelligent macrocell in accordance with the present invention.

In the embodiment shown in FIG. 4, based on the STRATIX™ family of devices available from Altera Corporation, each intelligent macrocell 40 according to the invention preferably includes thirteen inverters 41, two NAND gates 42, six CMOS transmission pairs 43 and fifteen NMOS transistors 44, although other numbers of these components could be used, depending on the structure of the corresponding conventional programmable logic device. None of components 41, 42, 43, 44 are connected to any other of components 41, 42, 43, 44 (except that NMOS transistor 430 and PMOS transistor 431 of each CMOS transmission pair 43 are connected to one another as shown). Connections between and among components 41, 42, 43, 44 are made when programming metallization layers are added to device 20 to implement a user design.

Figure 5:
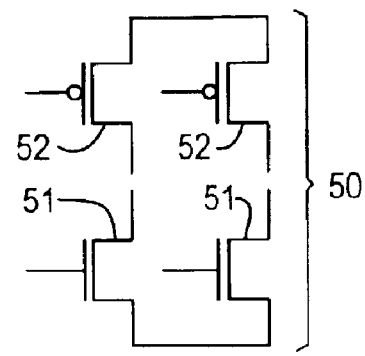
FIG. 5 is a schematic representation of a basic gate array.

The simplest known conventional gate array cell 50 is shown in FIG. 5, and includes two partially interconnected NMOS transistors 51 and two partially interconnected PMOS transistors 52. Other connections are intended to be made by the user to accomplish a particular logic function.

Figure 6:
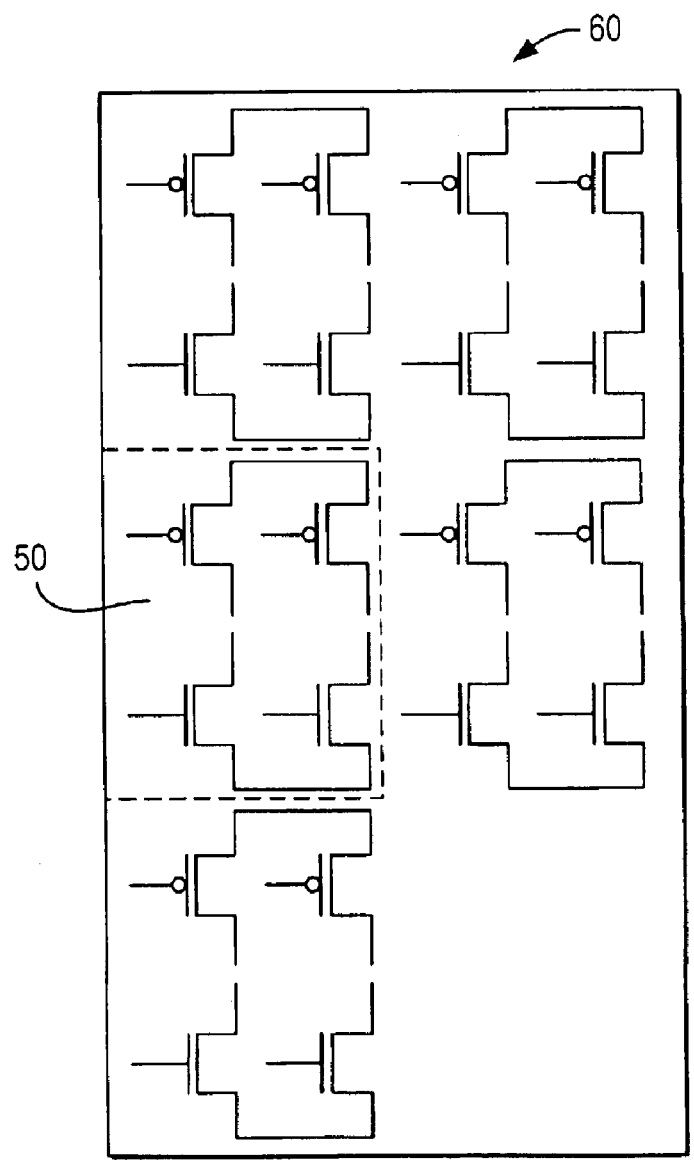
FIG. 6 is a schematic representation of a preferred embodiment of a gate array in accordance with the present invention.

Conventional gate array unit 60 of FIG. 6 is preferably the basic gate array unit in device 20 of the present invention. Gate array unit 60 preferably includes five gate array cells 50. Again, other than the basic connections discussed above in connection with FIG. 5, there are no connections between or among the cells 50 in gate array unit 60 until programming metallization layers are added to device 20 to implement a user design.

Figure 7:
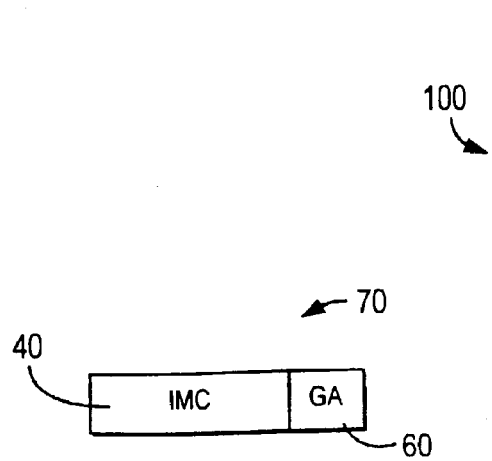
FIG. 7 is a schematic representation of a preferred embodiment of a logic element register in accordance with the present invention.

FIG. 7 shows a logic element register 70 according to a preferred embodiment of the invention. Register 70 preferably is formed using one of intelligent macrocells 40 and one of gate array units 60. Of the five cells 50 in gate array unit 60, three cells 50 preferably are used to construct six additional CMOS transmission pairs, in addition to the six CMOS transmission pairs present in macrocell 40. In addition, two cells 50 preferably are used to build on three-input NAND gate. All fifteen NMOS transistors 44 remain unused in this embodiment. The actual connections needed to combine macrocell 40 and gate array unit 60 into register 70 preferably are not formed until programming metallization layers are added to device 20 to implement a user design, as in known mask-programmable logic devices.

Figure 8:
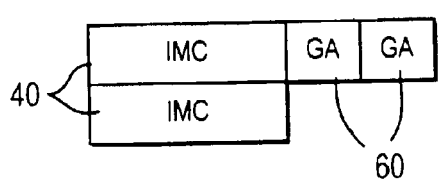
FIG. 8 is a schematic representation of a preferred embodiment of a look-up table in accordance with the present invention.

FIG. 8 shows a look-up table 80 according to a preferred embodiment of the invention. Look-up table 80 preferably is constructed using two of intelligent macrocells 40 and two of gate array units 60. Of the ten cells 50 in the two gate array units 60, seven cells 50 preferably are used to construct thirteen inverters, in addition to the twenty-six inverters 41 present in the two intelligent macrocells 40. In addition, two of the ten cells 50 in the two gate array units 60 preferably are used to construct three CMOS transmission pairs, in addition to the twelve CMOS transmission pairs 42 provided in the two intelligent macrocells 40. The one remaining cell 50, as well as one of the thirty NMOS transistors 44 in the two intelligent macrocells 40 remain unused in this embodiment. The actual connections needed to combine macrocells 40 and gate array units 60 into look-up table 80 preferably are not formed until programming metallization layers are added to device 20 to implement a user design, as in known mask-programmable logic devices.

As shown, an LE register 70 preferably can be formed using one of intelligent macrocells 40 and one of gate array units 60, while a look-up table 80 preferably can be formed using two of intelligent macrocells 40 and two of gate array units 60. Therefore, a logic element—i.e., a combination of a look-up table and a register—preferably can be formed using three of intelligent macrocells 40 and three of gate array units 60. The component usage, as expected, is the combination of the component usage discussed above for the LE register 70 and the look-up table 80, separately.

Figure 9:
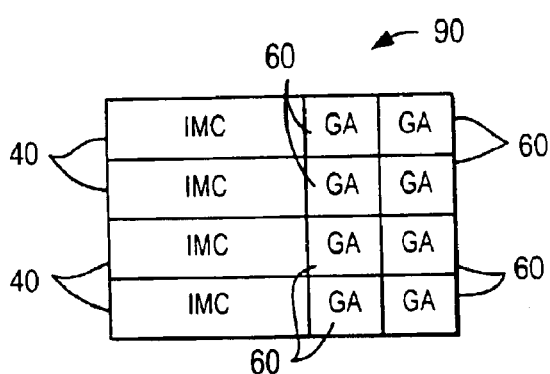
FIG. 9 is a schematic representation of a preferred embodiment of a logic array block control block in accordance with the present invention.

As another example, FIG. 9 shows that a LABwide control block 90 preferably can be formed from four of intelligent macrocells 40 and eight of gate array units 60. Of the forty cells 50 in eight gate array units 60, twenty-two of cells 50 preferably are used to form forty-four inverters in addition to the fifty-two inverters 41 among the four intelligent macrocells 40. Also, two of cells 50 among the eight gate array units 60 preferably are used to form one three-input NAND gate in addition to the eight two-input NAND gates among the four intelligent macrocells 40. In addition, seven of cells 50 among the eight gate array units 60 preferably are used to form three CMOS transmission pairs in addition to the twenty-four CMOS transmission pairs among the four intelligent macrocells 40. Finally, seven of cells 50 among the eight gate array units 60 preferably are used to form seven two-input NAND gates in addition to the eight two-input NAND gates among the four intelligent macrocells 40. Fifty-six of the sixty NMOS transistors 44 among the four intelligent macrocells 40 remain unused in this embodiment.

Figure 10:
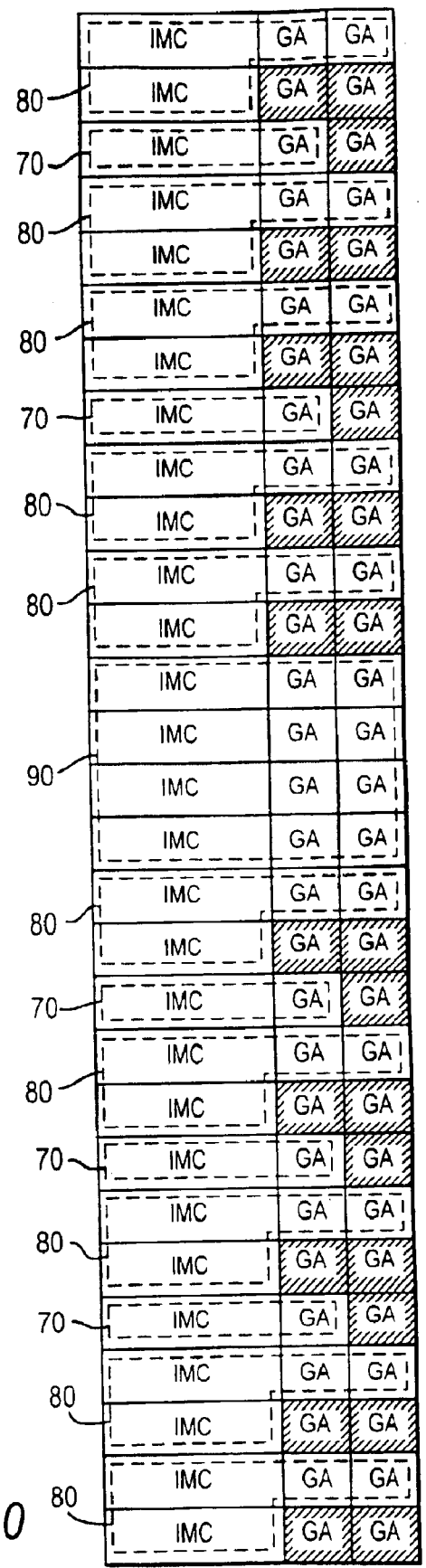
FIG. 10 is a schematic representation of an exemplary logic array block constructed from the components of FIGS. 7–9 in accordance with the present invention.

FIG. 10 shows an exemplary logic array block 100 formed in accordance with the present invention from intelligent macrocells 40 and gate array units 60. As can be seen, LAB 100 includes a LABwide control block 90, ten LUTs 80 and five LE registers 70, consuming twenty-nine intelligent macrocells 40 and thirty-three gate array units 60. Within the rectangular area occupied by LAB 100 are twenty-five additional unused gate array units 60 (cross-hatched). These unused gate array units 60 can be used for purposes similar to the auxiliary gates 15 in mask-programmable logic device 10.

Figure 11:
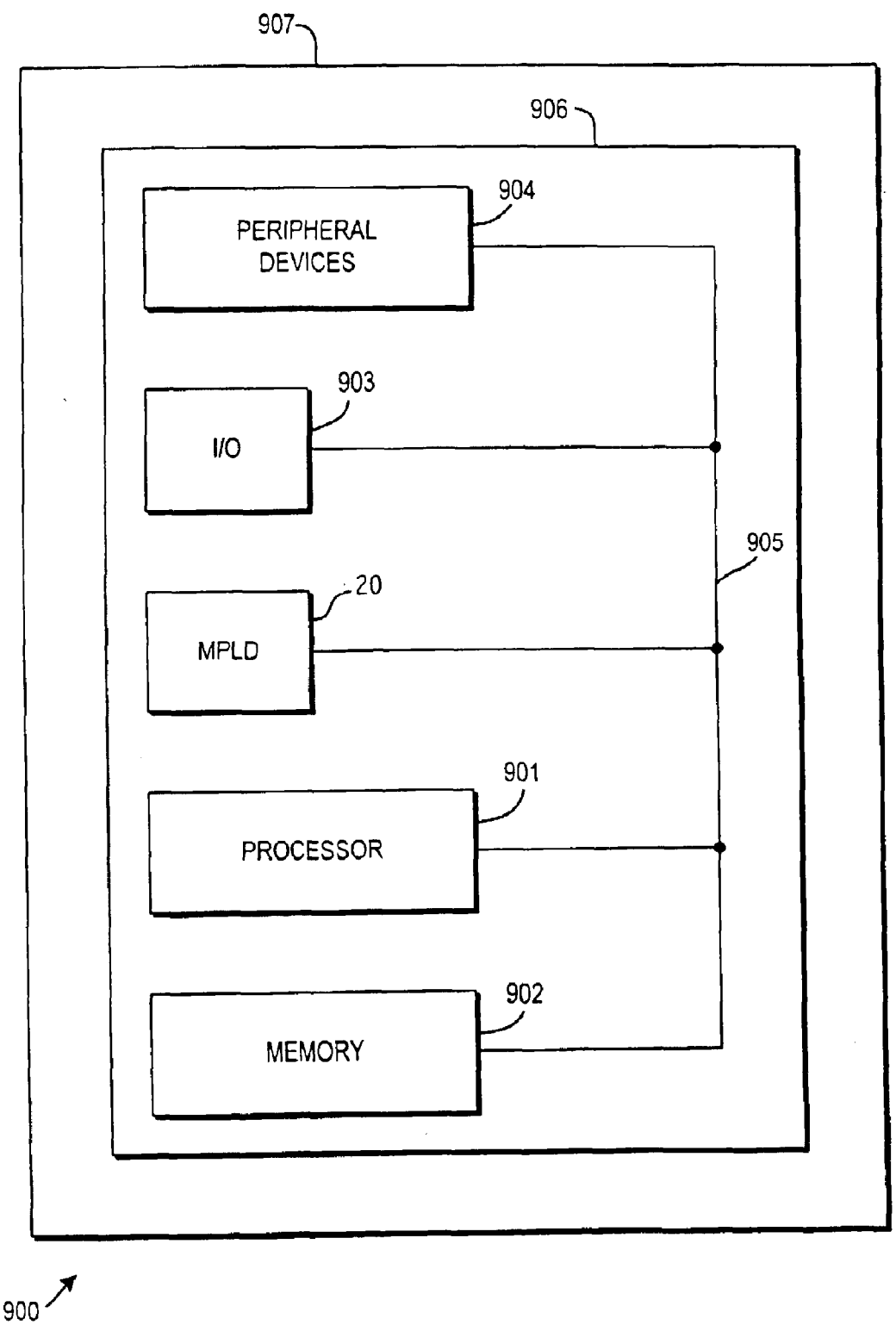
FIG. 11 is a simplified block diagram of an illustrative system employing a mask-programmable logic device in accordance with the present invention.

Mask-programmable logic device (MPLD) 20 according to the present invention may be used in many kinds of electronic devices. One possible use is in a data processing system 900 shown in FIG. 11. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. MPLD 20 can be used to perform a variety of different logic functions. For example, MPLD 20 can be configured as a processor or controller that works in cooperation with processor 901. MPLD 20 may also be used as an arbiter for arbitrating access to a shared resources in system 900. In yet another example, MPLD 20 can be configured as an interface between processor 901 and one of the other components in system 900. It should be noted that system 900 is only exemplary, and that the true scope and spirit of the invention should be indicated by the following claims.

Various technologies can be used to implement MPLDs 20 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device comprising:
   an array of programmable logic sub-units, each of said programmable logic sub-units comprising:
   a plurality of intelligent macrocells and a plurality of gate arrays, each of said intelligent macrocells and said gate arrays having contacts for connection to an interconnect structure for connecting said programmable logic sub-units into a plurality of programmable logic device logic units and configuring said plurality of programmable logic device logic units to perform one or more logic functions, each of said intelligent macrocells including a plurality of unconnected components adapted to be connected to one another to create logic; wherein:
   said plurality of unconnected components in each of said intelligent macrocells comprises:
   a first plurality of inverters;
   a second plurality of NAND gates; and
   a third plurality of CMOS transmission pairs; wherein:
   each of said inverters, said NAND gates and said CMOS transmission pairs is adapted to be connected to others of said inverters, said NAND gates and said CMOS transmission pairs, and to components outside their respective intelligent macrocells, by programming metallization layers.

2. The mask-programmable logic device of claim 1 wherein a combination of at least one of said intelligent macrocells and at least one of said gate arrays forms a programmable logic device logic unit selected from the group consisting of logic register, look-up table, and logic array block control unit.

3. The mask-programmable logic device of claim 2 further comprising at least one of each of at least one of input/output circuits, embedded memory blocks and clock generation circuits.

4. The mask-programmable logic device of claim 1 further comprising at least one of each of at least one of input/output circuits, embedded memory blocks and clock generation circuits.

5. The mask-programmable logic device of claim 1 wherein a combination of at least one of said intelligent macrocells and at least one of said gate arrays forms a programmable logic device logic unit selected from the group consisting of logic element register, look-up table, and logic array block control unit.

6. The mask-programmable logic device of claim 5 further comprising at least one of each of at least one of input/output circuits, embedded memory blocks and clock generation circuits.

7. The mask-programmable logic device of claim 1 further comprising at least one of each of at least one of input/output circuits, embedded memory blocks and clock generation circuits.

8. The mask-programmed logic device of claim 1 wherein said unconnected components are adapted to be connected to one another by virtue of each being adapted to receive a metallization.

9. A mask-programmed logic device comprising:
   an array of programmable logic sub-units, said programmable logic sub-units comprising:
   a plurality of intelligent macrocells and a plurality of gate arrays, each of said intelligent macrocells including a plurality of unconnected components adapted to be connected to one another to create logic, said plurality of unconnected components in each of said intelligent macrocells comprising:
   a first plurality of inverters,
   a second plurality of NAND gates, and
   a third plurality of CMOS transmission pairs, and
   at least one programming metallization layer that: (a) provides interconnections between ones of said inverters, said NAND gates and said CMOS transmission pairs and others of said inverters, said NAND gates and said CMOS transmission pairs, and to components outside their respective intelligent macrocells, and between said programmable logic sub-units to form programmable logic device logic units, (b) programs said programmable logic sub-units, thereby programming said programmable logic device logic units, and (c) provides interconnections between and among said programmed programmable logic device logic units.

10. The mask-programmed logic device of claim 9 wherein:
each of said at least one programming metallization layer has a fixed user-designed configuration; and
said user-designed configuration programs said logic device to perform a user-selected combination of one or more logic functions.

11. The mask-programmed logic device of claim 10 wherein each of said at least one programming metallization layer comprises at least one of:
conduction elements that interconnect ones of said unconnected components;
conduction elements that program said programmable logic sub-units; and
conductors that interconnect said programmable logic sub-units.

12. The mask-programmed logic device of claim 9 wherein a combination of at least one of said intelligent macrocells and at least one of said gate arrays forms a programmable logic device logic unit selected from the group consisting of logic register, look-up table, and logic array block control unit.

13. The mask-programmed logic device of claim 12 further comprising at least one of each of at least one of input/output circuits, embedded memory blocks and clock generation circuits.

14. The mask-programmed logic device of claim 9 further comprising at least one of each of at least one of input/output circuits, embedded memory blocks and clock generation circuits.

15. The mask-programmed logic device of claim 9 wherein a combination of at least one of said intelligent macrocells and at least one of said gate arrays forms a programmable logic device logic unit selected from the group consisting of logic element register, look-up table, and logic array block control unit.

16. The mask-programmed logic device of claim 15 further comprising at least one of each of at least one of input/output circuits, embedded memory blocks and clock generation circuits.

17. The mask-programmed logic device of claim 9 further comprising at least one of each of at least one of input/output circuits, embedded memory blocks and clock generation circuits.

18. The method claim 9 wherein wherein said unconnected components are adapted to be connected to one another by virtue of each being adapted to receive a metallization.

19. A method of programming a mask-programmable logic device, said method comprising:
providing a mask-programmable base device including an array of programmable logic sub-units, said programmable logic sub-units comprising a plurality of intelligent macrocells and a plurality of gate arrays, each of said intelligent macrocells including a plurality of unconnected components adapted to be connected to one another to create logic, said plurality of unconnected components comprising:
a first plurality of inverters,
a second plurality of NAND gates, and
a third plurality of CMOS transmission pairs, and
applying at least one programming metallization layer that
(a) provides interconnections between ones of said inverters, said NAND gates and said CMOS transmission pairs and others of said inverters, said NAND gates and said CMOS transmission pairs, and to components outside their respective intelligent macrocells, and between said programmable logic sub-units to form programmable logic device logic units, (b) programs said programmable logic sub-units, thereby programming said programmable logic device logic units, and (c) provides interconnections between and among said programmed programmable logic device logic units.

20. The method of claim 19 wherein:
said applying comprises applying at least one programming metallization layer each of which has a user-designed configuration; and
said user-designed configuration programs said logic device to perform a user-selected combination of one or more logic functions.

21. The method of claim 19 wherein:
said applying comprises applying at least one programming metallization layer that comprises at least one of:
conduction elements that interconnect ones of said unconnected components;
conduction elements that program said programmable logic sub-units; and
conductors that interconnect said programmable logic sub-units.

22. The method of claim 19 wherein a combination of at least one of said intelligent macrocells and at least one of said gate arrays forms a programmable logic device logic unit selected from the group consisting of logic register, look-up table, and logic array block control unit.

23. The method of claim 22 further comprising providing at least one of each of at least one of input/output circuits, embedded memory blocks and clock generation circuits.

24. The method of claim 19 further comprising providing at least one of each of at least one of input/output circuits, embedded memory block and clock generation circuits.

25. The method of claim 19 wherein a combination of at least one of said intelligent macrocells and at least one of said gate arrays forms a programmable logic device logic unit selected from the group consisting of logic element register, look-up table, and logic array block control unit.

26. The method of claim 25 further comprising providing at least one of each of at least one of input/output circuits, embedded memory blocks and clock generation circuits.

27. The method of claim 19 further comprising providing at least one of each of at least one of input/output circuits, embedded memory blocks and clock generation circuits.

28. The logic device of claim 19 wherein wherein said unconnected components are adapted to be connected to one another by virtue of each being adapted to receive a metallization.

29. A logic device comprising:
an array of programmable logic sub-units, at least one of said programmable logic sub-units comprising:
a plurality of intelligent macrocells and a plurality of gate arrays, each of said intelligent macrocells including (a) a plurality of unconnected components adapted to be connected to one another to create logic said plurality of unconnected components in each of said intelligent macrocells comprising:
a first plurality of inverters,
a second plurality of NAND gates, and
a third plurality of CMOS transmission pairs; and
(b) contacts for connection to a first interconnect structure for connecting ones of said unconnected components to one another including contacts for connecting any of said inverters, said NAND gates and said CMOS transmission pairs to others of said inverters, said NAND gates and said CMOS transmission pairs, and to components outside their respective intelligent macrocells, by connection to programming metalization layers each of said intelligent macrocells and said gate arrays further having contacts for connection to a second interconnect structure for connecting said programmable logic sub-units into a plurality of logic units and configuring said plurality of logic units to perform one or more logic functions.

30. The logic device of claim 29 further comprising said first and second interconnect structures; wherein:
said second interconnect structure is programmable; whereby:
said logic device is programmable.

31. The logic device of claim 29 further comprising said first and second interconnect structures; wherein:
said second interconnect structure has a fixed user-designed configuration; and
said user-designed configuration programs said logic device to perform a user-selected combination of said one or more logic functions.

32. The logic device of claim 31 wherein said second interconnect structure comprises at least one of:
conduction elements that program said programmable logic sub-units; and
conductors that interconnect said programmable logic sub-units.

33. The logic device of claim 29 wherein a combination of at least one of said intelligent macrocells and at least one of said gate arrays forms a programmable logic device logic unit selected from the group consisting of logic register, look-up table, and logic array block control unit.

34. The logic device of claim 33 further comprising at least one of each of at least one of input/output circuits, embedded memory blocks and clock generation circuits.

35. The logic device of claim 29 further comprising at least one of each of at least one of input/output circuits, embedded memory blocks and clock generation circuits.

36. The logic device of claim 29 wherein a combination of at least one of said intelligent macrocells and at least one of said gate arrays forms a programmable logic device logic unit selected from the group consisting of logic element register, look-up table, and logic array block control unit.

37. The logic device of claim 36 further comprising at least one of each of at least one of input/output circuits, embedded memory blocks and clock generation circuits.

38. The logic device of claim 29 further comprising at least one of each of at least one of input/output circuits, embedded memory blocks and clock generation circuits.

39. The mask-programmable logic device of claim 29 wherein said unconnected components are adapted to be connected to one another by virtue of each being adapted to receive a metallization.

* * * * *